United States Patent [19]

Prinz

[11] Patent Number: 5,541,868
[45] Date of Patent: Jul. 30, 1996

[54] ANNULAR GMR-BASED MEMORY ELEMENT

[75] Inventor: Gary A. Prinz, Alexandria, Va.

[73] Assignee: The United States of America as represented by the Secretary of the Navy, Washington, D.C.

[21] Appl. No.: 391,971

[22] Filed: Feb. 21, 1995

[51] Int. Cl.$^6$ .................................................. G11C 17/02
[52] U.S. Cl. ............................ 365/98; 365/100; 365/173
[58] Field of Search ............................... 365/98, 97, 100, 365/173

[56] References Cited

U.S. PATENT DOCUMENTS

| | | | |
|---|---|---|---|
| 3,564,516 | 2/1971 | Janisch et al. | 365/97 |
| 3,964,034 | 6/1976 | Torok et al. | 340/174 TF |
| 5,173,873 | 12/1992 | Wu et al. | 365/173 |
| 5,329,486 | 7/1994 | Lage | 365/98 |
| 5,448,515 | 9/1995 | Fukami et al. | 365/173 |

OTHER PUBLICATIONS

Thompson et al., "Thin Film Magnetoresistors In Memory, Storage, And Related Applications", IEEE Transactions on Magnetics 11 (4) 1039–50 (Jul. 1975).
Binasch et al., "Enhanced Magnetoresistance In Layered Magnetic Structures With Antiferromagnetic Interlayer Exchange", Physical Rev. B. 39 (7) 4828–30 (Mar. 1, 1989).
Louis, "Thin Film Magnetic Storage Element", IBM Tech. Disclosure Bull. 6 (10) 99–100 (Mar. 1964).
Kump et al., "Coupled NDRO Magnetic Film Memory", IBM Tech. Disclosure Bull. 13 (7) 2110–11 (Dec. 1970).
Archey et al., "Double Layer Memory Device", IBM Technical Disclosure Bull. 12 (7) 1039 (Dec. 1987).

*Primary Examiner*—David C. Nelms
*Assistant Examiner*—Huan Hoang
*Attorney, Agent, or Firm*—Thomas E. McDonnell; John J. Karasek

[57] ABSTRACT

A memory element has a sandwich structure in which rings of ferromagnetic material are spaced apart by a layer of a non-magnetic conductor (which is also typically a ring). These ferromagnetic rings will have differing magnetic hardness. At least one ring will be magnetically hard or antiferromagnetically-pinned. At least one other ring will be magnetically softer than the hard or antiferromagnetically-pinned ring. The non-magnetic conductor is at least thick enough to prevent essentially all exchange coupling between the ferromagnetic rings. Conducting leads provide current to pass through the ferromagnetic rings, perpendicular to magnetic moments in the ferromagnetic rings.

21 Claims, 5 Drawing Sheets

ANNULAR GMR-BASED MEMORY ELEMENT

BACKGROUND OF THE INVENTION

1. Field of the Invention

The present invention relates generally to ferromagnetic memory and more specifically to ferromagnetic memory utilizing giant magnetoresistance and spin polarization in annular memory elements.

2. Description of the Related Art

For many years, random access memory for computers was constructed from magnetic elements. This memory had the advantage of very high reliability, nonvolatility in the event of power loss and infinite lifetime under use. Since this memory was hand assembled from three-dimensional ferrite elements, it was eventually supplanted by planar arrays of semiconductor elements. Planar arrays of semiconductors can be fabricated by lithography at a much lower cost than the cost of fabricating prior art magnetic ferrite memory elements. Additionally, these semiconductor arrays are more compact and faster than prior art ferrite magnetic memory elements. Future benefits of increasingly smaller scale in semiconductor memory are now jeopardized by the concern of loss of reliability, since very small scale semiconductor elements are not electrically robust.

Non-volatile magnetic memory elements that are read by measuring resistance have been previously demonstrated by Honeywell Corporation. These systems operate on the basis of the classical anisotropic magneto-resistance phenomena, which results in resistance differences when the magnetization is oriented perpendicular versus parallel to the current. Previous work by others has shown that a 2% change in resistance is sufficient to permit the fabrication of memory arrays compatible with existing CMOS computer electronics. Unfortunately, scaling of these elements down from the current 1 µm size has proved challenging.

The carriers in devices can be identified not only as electrons and holes, but also by their spin state being "up" or "down". Just as polarized light may be easily controlled by passing it through crossed polarizers, spin polarized electron current can be created, controlled and measured by passing it between magnetic films whose relative magnetic moments can be rotated. The spin polarization manifests itself as an extra resistance in a magnetic circuit element, commonly referred to as magneto-resistance. The modern manifestation of magneto-resistance should not be confused with older observations common to semiconductors and metal in which the carriers are merely deflected by the classical Lorentz force ($\vec{V} \times \vec{B}$) in the presence of a magnetic field. This modern effect is purely quantum mechanical and occurs when two ferromagnetic metals are separated by a non-magnetic conductor. When a bias voltage causes carriers to flow from one magnetic metal into the other through the intervening conductor, the spin-polarization of the carriers can play a dominant role. The carriers leaving the first ferromagnetic metal are highly polarized because they are emitted from band states which are highly polarized. The resistance which they meet in trying to enter the second ferromagnetic layer depends strongly upon the spin polarization of the states available to them. If the ferromagnetic moments of the two magnetic metals are aligned, then the spin descriptions of the states are the same in the two materials and carriers will pass freely between them. If the two moments are anti-aligned, then the states are oppositely labeled (i.e., "up" in the first ferromagnetic layer is "down" in the second ferromagnetic layer), the carriers will find that they have fewer states to enter and will experience a higher resistance. This phenomenon is now commonly referred to as the spin-valve effect. By simply measuring the resistance between two magnetic layers, one can determine if their magnetic moments are parallel or anti-parallel.

Successful application of the spin-valve effect to magnetic memory elements would preferably minimize the cancellation of the magnetization in one ferromagnetic layer by fringing fields associated with the magnetization in another ferromagnetic layer.

SUMMARY OF THE INVENTION

Accordingly, it is an object of this invention to produce an inexpensive non-volatile random access ferromagnetic memory.

It is another object of the present invention to produce a non-volatile ferromagnetic random access memory that is faster than the presently available semiconductor random access memory.

It is a further object of the present invention to produce a highly compact non-volatile random access ferromagnetic memory.

It is a further object of the present invention to produce a non-volatile random access ferromagnetic memory based on the spin-valve effect having no significant, or minimal, cancellation of the magnetization in one ferromagnetic layer by fringing fields associated with the magnetization in another ferromagnetic layer.

It is a further object of the present invention to produce a non-volatile random access ferromagnetic memory that, when incorporated into an array, will eliminate or minimize cross-talk between elements.

These and additional objects of the invention are accomplished by a non-volatile random access memory element that employs giant magnetoresistance (GMR), i.e., the spin-valve effect. The memory element has a sandwich structure in which rings of ferromagnetic material are spaced apart by a layer of a non-magnetic conductor (which is also typically a ring). These ferromagnetic rings will have differing magnetic hardness. At least one ring will be magnetically hard or antiferromagnetically-pinned. At least one other ring will be magnetically softer than the hard or antiferromagnetically-pinned ring. The non-magnetic conductor is at least thick enough to prevent essentially all exchange coupling between the ferromagnetic rings. Conducting leads provide current to pass through the ferromagnetic rings, perpendicular to magnetic moments in the ferromagnetic rings.

The memory element may have more than one hard or antiferromagnetically pinned ring, and more than one softer ferromagnetic ring. Ferromagnetic rings should be separated by nonmagnetic conductive layers, as described above. Usually, hard or antiferromagnetically pinned rings will be alternated with softer ferromagnetic rings.

A hard or antiferromagnetically-pinned ferromagnetic ring will have a fixed magnetic state, a closed magnetic circuit, whose moment is oriented either clockwise or counterclockwise around the ring. A softer ferromagnetic ring will have a closed magnetic circuit whose moment is oriented either clockwise or counterclockwise around the ring. This orientation will be reversible so that the magnetizations in the hard and soft ferromagnetic rings selectively may be either aligned or anti-aligned.

When a voltage is applied across the two ferromagnetic rings, the resistance varies depending upon whether the magnetic moments of these rings are aligned in the same direction with respect to each other. Resistance between the two layers increases when the magnetic moments of these two ferromagnetic rings are not aligned in the same direction, i.e, anti-parallel (anti-aligned). The resistance between the two rings drops when the magnetic moments of these two ferromagnetic rings are in essentially the same direction (parallel). The parallel state can be assigned a value of "0" or "1" while the antiparallel state can be assigned, respectively, a value of "1" or "0". Thus, the alignment status of each memory element according to the present invention represents a bit of information.

The bit can be altered in a memory element according to the present invention by applying a sufficiently high current through the conducting leads in order to generate a magnetic field sufficient to align, in one direction, the magnetic moment of any soft ferromagnetic ring along one of the easy directions of orientation. The direction of orientation favored by the orienting current is of course determined by the polarity of that orienting current. Once set, the bit may be read by applying a smaller current through the appropriate conducting leads and determining whether the resistance is more or less than that of a reference resistance.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DETAILED DESCRIPTION OF THE PREFERRED EMBODIMENTS

The following United States Patent Applications are incorporated herein by reference, in their entirety and for all purposes: Ser. No. 08/130,479, filed Oct. 1, 1993 by Gary A. Prinz, now U.S. Pat. No. 5,477,482 and Ser. No. 08/130,480, filed Oct. 1, 1993 by Gary A. Prinz et al., now U.S. Pat. No. 5,475,304.

Throughout the specification and the claims that follow, it should be understood the terms "upper" and "lower" are used as terms of convenience to distinguish various surfaces relative to each other. Neither "upper" nor "lower," as used in the specification and claims that follow, imply the orientation of any element with respect to the gravitational field. Likewise, the terms "clockwise" and "counterclockwise" are used as terms of convenience to distinguish rotational directions relative to each other.

Throughout the specification and the claims that follow, it should be understood the term "ring" means a closed loop. While a ring is preferably in the shape of a circular washer, other shapes (e.g., elliptical, oval, square, etc.) are permissible. Ferromagnetic rings will constitute closed magnetic circuits.

The present invention uses the spin-valve effect as the basis of a memory element. In the memory element of the present invention, the two states, parallel and anti-parallel, represent two bits, "0" and "1". Of course, each state may be arbitrarily assigned a value of "0" or "1", provided that when the parallel state is assigned a value of "0", the antiparallel state is assigned a value of "1" and when the parallel state is assigned a value of "1", the antiparallel state is assigned a value of "0". The state of the memory element may be readily interrogated by measuring the resistance.

Figure 1:
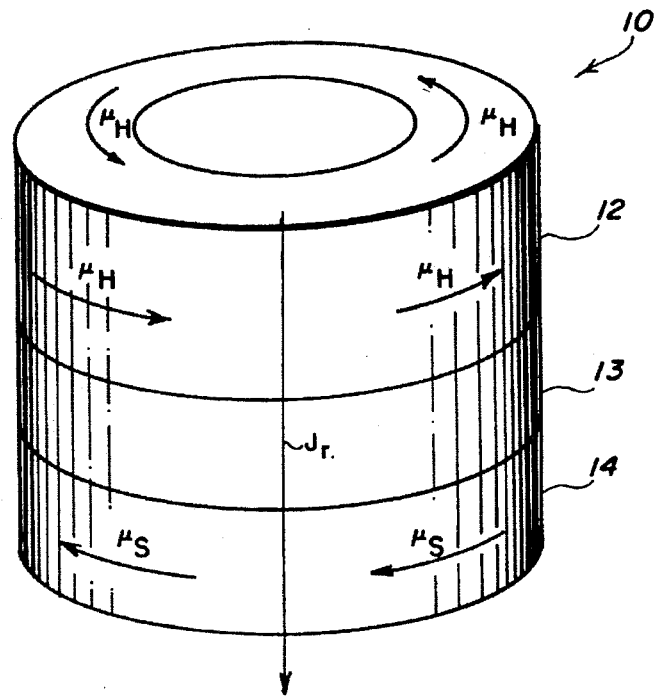
FIG. 1 shows the active portion of a non-volatile random access memory element according to the present invention in a high resistance state.
Figure 2:
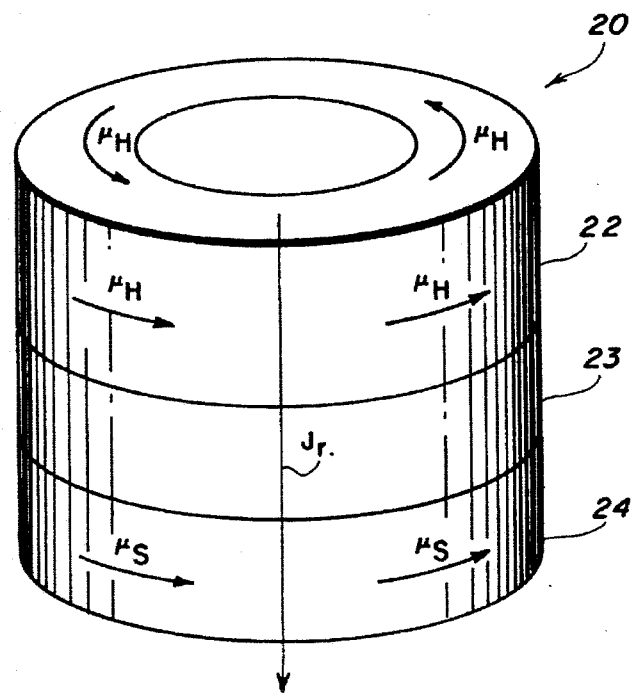
FIG. 2 shows the active portion of a non-volatile random access memory element according to the present invention in a low resistance state.

This principle can by illustrated by reference to FIGS. 1 and 2. In FIG. 1, the active portion of a nonvolatile memory element 10 (i.e., the memory element without top and bottom contacts, which have been removed for clarity of illustration) according to the invention is shown. A hard ferromagnetic ring 12, a nonmagnetic metal ring 13, and a soft ferromagnetic ring 14 are stacked like a set of washers, and are in electrical contact. The hard ferromagnetic ring 12 and soft ferromagnetic ring 14 have antiparallel magnetizations $\mu_h$ and $\mu_s$, respectively, as shown by the arrows. In FIG. 2, the active portion of a memory element 20 (i.e., the memory element without top and bottom contacts, which have been removed for clarity of illustration) according to the invention is shown. A hard ferromagnetic ring 22, a nonmagnetic metal ring 23, and a soft ferromagnetic ring 24 are stacked like a set of washers, and are in electrical contact. The hard ferromagnetic ring 22 and soft ferromagnetic ring 24 have parallel magnetizations $\mu_h$ and $\mu_s$, respectively, as shown by the arrows. If a read current $J_r$ is directed through these structures 10,20, the electrical resistance across 10 will be higher than the electrical resistance across 20, in accordance with the spin-valve effect.

Antiferromagnetically-pinned rings will be desirable for the harder ferromagnetic layer. An antiferromagnetically-pinned ring will be very hard, since an antiferromagnetic pinning layer essentially fixes the direction and magnitude of the magnetic moment of the ferromagnetic layer that it contacts. With an essentially fixed magnetic moment for the harder ferromagnetic rings, a relatively hard material may be used for the softer ferromagnetic rings, to provide better ruggedness against magnetically hostile environments.

Figure 3:
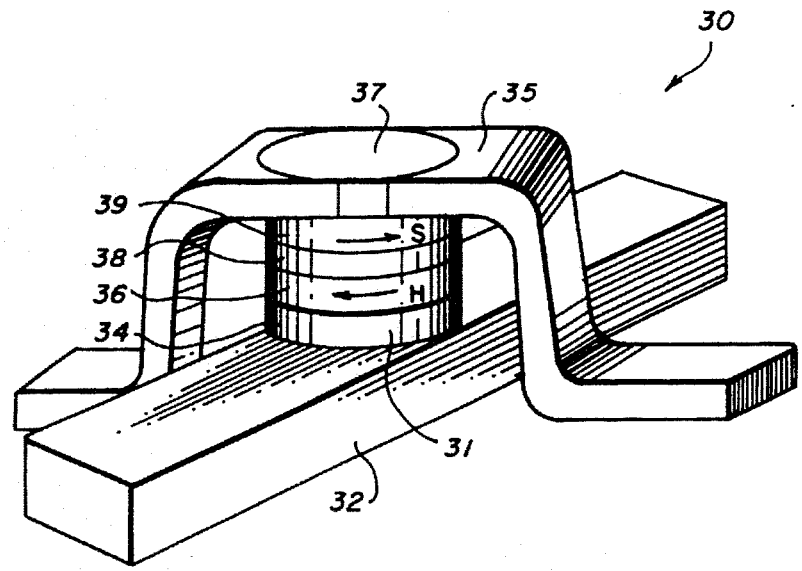
FIG. 3 shows a non-volatile random access memory element according to the present invention in a high resistance state.

FIG. 3 shows a memory element 30 having a plurality of interfaces which interact with spin-polarized carriers. The structure of memory element 30 is similar to the structure of memory element 10 shown in FIG. 1. Except where noted, analogous structures perform analogous function, and essentially the same considerations apply when selecting appropriate materials and dimensions. Memory element 30 includes bottom conducting lead 32. The upper surface of bottom conducting lead 32 supports and physically contacts the lower surface of optional layer 34 of non-magnetic material. The upper surface of optional antiferromagnetic ring 31, if present, is sandwiched between and physically contacts layer 34 of non-magnetic material and ring 36 of hard ferromagnetic metal.

If optional antiferromagnetic layer 31 is absent, the lower surface of ring 36 of hard magnetic ferromagnetic metal, for example, Co, rests on and physically contacts the upper surface of the non-magnetic layer 34. If both optional antiferromagnetic layer 31 and layer 34 of nonmagnetic material are absent, the lower surface of ring 36 rests on and physically contacts the upper surface of bottom conducting lead 32. Hard ferromagnetic ring 36 has a fixed magnetization that is oriented either clockwise or counterclockwise.

The lower surface of non-magnetic ring 38 rests on and physically contacts the upper surface of hard ferromagnetic ring 36 and serves as the intervening, non-magnetic layer required for the spin-valve effect. The upper surface of non-magnetic ring 36 supports and physically contacts the soft ferromagnetic ring 39. The bottom surface of top conducting lead 35 rests on and physically contacts the upper surface of optional layer 37 of conducting non-magnetic material. If optional layer 37 is absent, the bottom surface of top conducting lead 35 rests upon and physically contacts the upper surface of ferromagnetic ring 39. As shown in FIG. 3, the magnetizations of ferromagnetic rings 34,38 are antiparallel, and therefore the element is in a high resistance state.

The direction of the magnetization of ring 39 is reversible. Various embodiments of the invention will use various means for reversing the magnetization of ring 39, and thereby storing a data bit. Most typically, the magnetization of ring 39 will be effected by directing a writing current $J_w$ pulse near or through ring 39. This writing current pulse may use the same or a different conductive pathway than that of a read current $J_r$.

Figure 4:
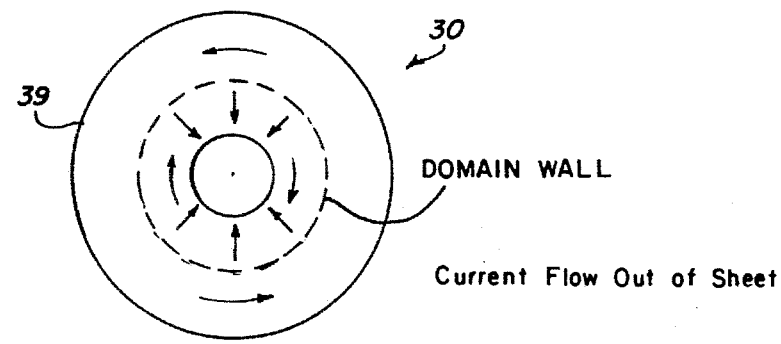
FIG. 4 shows a top sectional view of a non-volatile random access memory element according to the present invention during a writing step.

Referring to FIG. 4, if a sufficiently large writing current $J_w$ pulse flows from bottom conducting lead 32 to top conducting lead 35 (i.e., with reference to FIG. 4 current flow is out of the drawing sheet), this current will create a magnetic field, and the magnetization of the soft magnetic ring 39 will be reversed. Harder magnetic ring 36 (not shown) will be unaffected by $J_w$, due to its higher coercivity. This reversal of magnetization in ring 39 typically will be abrupt. Without wishing to be bound by theory, it is believed that as writing current $J_w$ is applied, a domain wall is formed at the outer perimeter of the soft magnetic ring 39, and this domain wall rapidly moves to the inner diameter of the soft magnetic ring 39, as indicated by the arrows.

Figure 5:
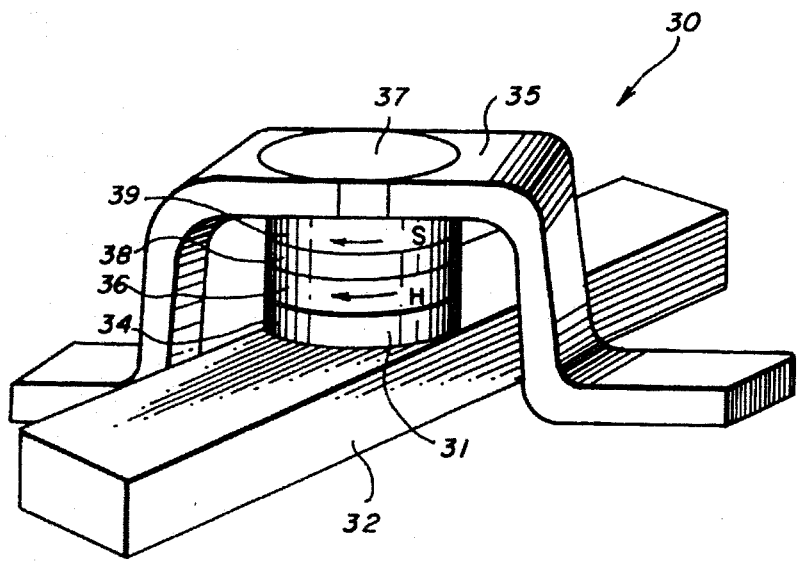
FIG. 5 shows a non-volatile random access memory element according to the present invention in a low resistance state.

As shown in FIG. 5, after the application of the pulse of writing current $J_w$, the magnetizations of ferromagnetic rings 34,38 are parallel, and therefore the element is in a low resistance state. Reversing the direction of $J_w$ will reverse the change to the magnetization of soft magnetic ring 39.

Because ΔR/R effects come primarily from interfacial spin scattering, it is desirable to provide memory elements having a multilayer structure, with a maximum of interfaces being forced into a length less than the spin-relaxation length. To this end, a multilayered memory element according to the present invention includes alternating rings of hard magnetic and soft magnetic materials spaced from each other by intervening layers of nonmagnetic conductive material.

Figure 6:
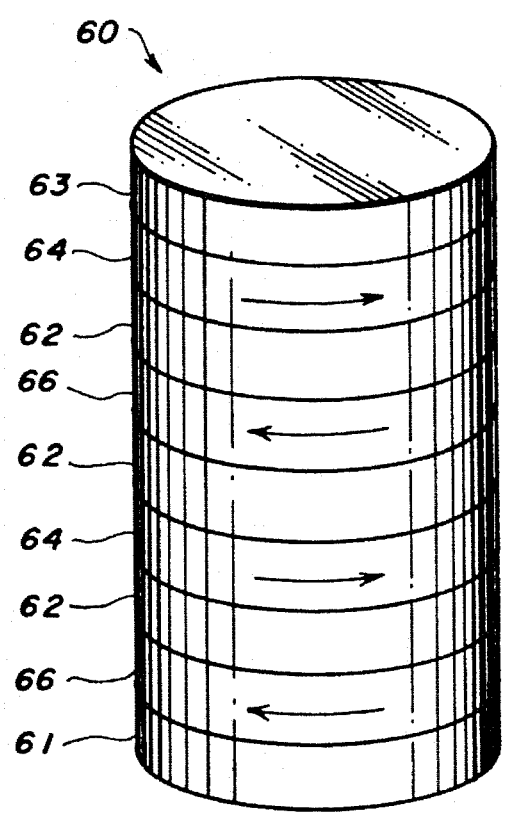
FIG. 6 shows the active portion of a multilayer non-volatile random access memory element according to the present invention in a high resistance state.
Figure 7:
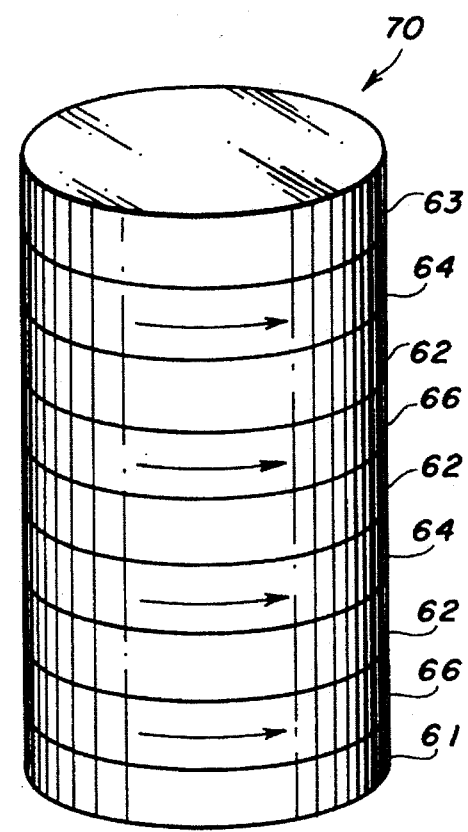
FIG. 7 shows the active portion of a multilayer non-volatile random access memory element according to the present invention in a low resistance state.

In FIG. 6, the active portion of a multilayer nonvolatile memory element 60 (i.e., the memory element without the top and bottom contacts, which have been removed for clarity of illustration) according to the invention is shown. Active portion 60 includes bottom nonmagnetic conducting layer 61. Active portion 60 includes top nonmagnetic conducting layer 63. Between the bottom nonmagnetic conducting layer 61 and the top nonmagnetic conducting layer 63 are a plurality of hard magnetic or antiferromagnetically-pinned rings 64, alternating with soft magnetic rings 66. The hard magnetic or antiferromagnetically-pinned rings 64 and soft magnetic rings 66 are separated by intervening nonmagnetic conductive rings 62, so that the structure 60 forms a conductive stack. As shown in FIG. 6, the hard magnetic or antiferromagnetically-pinned rings 64 and soft magnetic rings 66 may have alternating magnetizations, thus creating a high resistance across the device 60. As shown in FIG. 7, the hard magnetic or antiferromagnetically-pinned rings 64 and soft magnetic rings 66 may have aligned magnetizations, thus creating a low resistance across the device 60.

Preferably, current flow through a non-volatile random access memory element according to the present invention will be uniform and perpendicular to the ferromagnetic rings. No central core of magnetic or conductive material is required for any of the above-described embodiments of the present invention. Frequently, the core of an element according to the invention will be a dielectric. This dielectric core will help confine the read and write currents to the ferromagnetic rings and the nonmagnetic conductive rings, as is preferred. Moreover, this dielectric core may also simplify manufacture of the preferred solid planar end nonmagnetic conducting layers.

It may be desirable for some embodiments of the present invention to have a diode in the memory element, to restrict current flow to a single direction. This is most typically advantageous if a plurality of elements are connected in an x-y bit array. To address a single element in an x-y bit array, it is typically desired to confine current flow to a single direction. However, this is not an obstacle in a word array.

Figure 8:
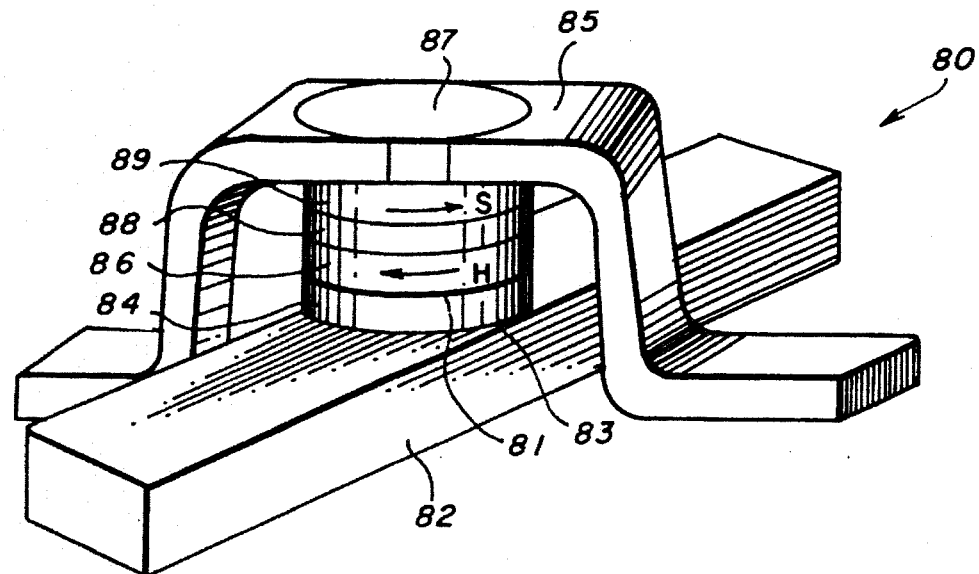
FIG. 8 shows a non-volatile random access memory element according to the present invention with an optional diode.

As shown in FIG. 8, an embodiment of a non-volatile random access memory element according to the present invention 80 will include a diode 83. This diode 83 may be interposed between the bottom conducting lead 82 and the lower surface of layer 84 of non-magnetic material. The diode alternatively may be disposed between the top conducting lead 85 and the upper surface of layer 87 of non-magnetic material. The diode alternatively may be disposed between two adjacent structures in the element 80.

Embodiments of the non-volatile random access memory element according to the present invention which incorporate a diode will generally include a separate writing circuit for applying writing current $J_w$, so that $J_w$ can flow in two directions. There are several advantages to such an embodiment. Separate reading and writing circuits permit each to be optimized. Separate reading and writing circuits permit simultaneous reading and writing of elements in an array, permitting faster operation. Such an embodiment can be integrated more readily into an x-y bit array. Field distribution in memory elements may be more uniform during a writing step.

Figure 9:
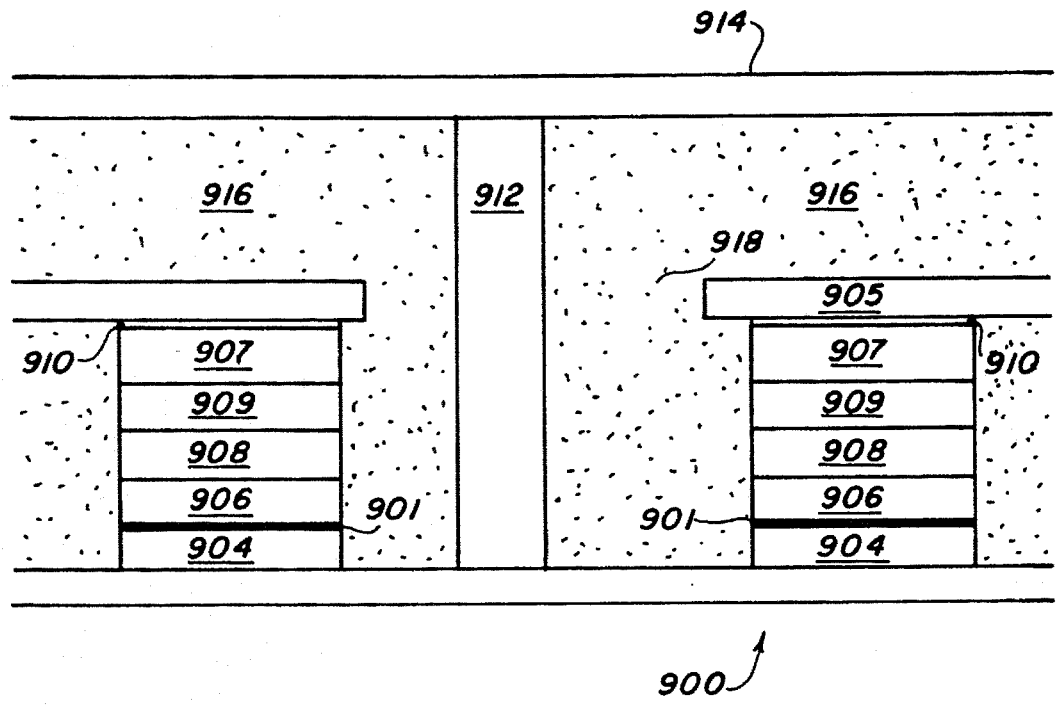
FIG. 9 shows a side sectional view of a non-volatile random access memory element according to the present invention with a separate writing circuit.
Figure 10:
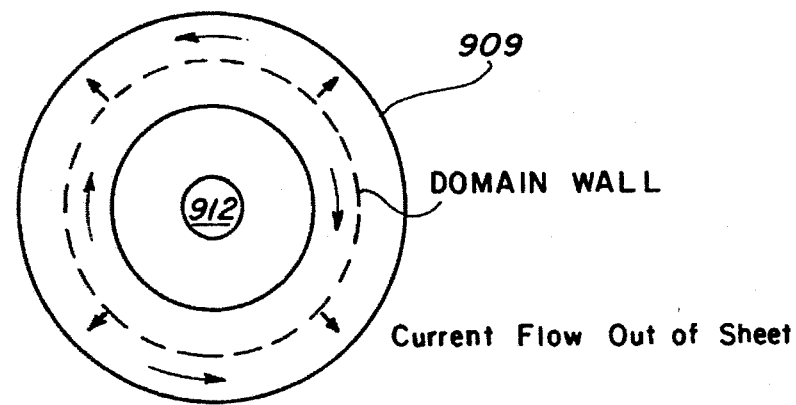
FIG. 10 shows a top sectional view of a non-volatile random access memory element according to the present invention with a separate writing circuit.

In an embodiment of the invention, a separate circuit is provided for supplying writing current $J_w$. An example of such an embodiment is shown in FIGS. 9 and 10. In FIG. 9, memory element 900 includes bottom conducting lead 902. The upper surface of bottom conducting lead 902 supports and physically contacts the lower surface of optional ring 904 of non-magnetic material, if present. The upper surface of optional antiferromagnetic ring 901, if present, is sandwiched between and physically contacts layer 904 of non-magnetic material and ring 906 of hard ferromagnetic metal. If optional antiferromagnetic ring 901 and nonmagnetic material 904, are absent, the lower surface of ring 906 of hard magnetic ferromagnetic metal, for example, Co, rests on and physically contacts the upper surface of bottom conducting lead 902. Likewise, if optional antiferromagnetic ring 901 is absent, the lower surface of ring 906 of hard magnetic ferromagnetic metal rests on and physically contacts the upper surface of nonmagnetic material 904. Hard ferromagnetic ring 906 has a fixed magnetization that is oriented either clockwise or counterclockwise.

The lower surface of non-magnetic ring 908 rests on and physically contacts the upper surface of hard ferromagnetic ring 906 and serves as the intervening, non-magnetic layer required for the spin-valve effect. The upper surface of non-magnetic ring 906 supports and physically contacts the soft ferromagnetic ring 909. The bottom surface of top conducting lead 905 also rests upon and physically contacts the upper surface of soft ferromagnetic ring 909. Alternatively, ring 907 of conducting, non-magnetic material may be interposed between and contact soft ferromagnetic ring 909 and top conducting lead 905. The position of soft ferromagnetic ring 909 may be switched with the position of hard ferromagnetic ring 906 (and any antiferromagnetic pinning ring).

Top conducting lead 905 includes a pass-though 918. Writing conductor 912 is positioned axially with respect to rings 904, 901, 906, 908, 909, 907, and goes through pass-through 918. Writing conductor 912 electrically connects with top writing conducting lead 914 with bottom conducting lead 902. Alternatively, a separate bottom writing conducting lead may be employed. Dielectric 916 maintains proper electrical isolation.

Writing is effected by directing writing current $J_w$ through writing conductor 912. As shown in FIG. 10, it is believed that directing current through writing conductor 912 (out of the drawing sheet in FIG. 10), a domain wall is formed at the inner perimeter of the soft magnetic ring 909, and this domain wall rapidly moves to the outer diameter of the soft magnetic ring 909, as indicated by the arrows, thus reversing the magnetization of soft magnetic ring 909.

Preferably, the ferromagnetic rings have thicknesses of about 10 Å to about 100 Å. More preferably, the ferromagnetic rings have thicknesses of about 50 Å to about 100 Å. Preferably, the nonmagnetic conductive layers and rings have thicknesses of about 10 Å to about 100 Å. More preferably, the nonmagnetic conductive layers and rings have thicknesses of about 50 Å to about 100 Å.

Typically the ferromagnetic rings are Fe, Co, or Ni. Typically, the hard ferromagnetic rings are selected from the alloys described in U.S. Pat. No. 4,402,770 to Norman C. Koon. Typically, the soft magnetic alloys are selected from the alloys described in U.S. Pat. No. 4,402,043, to Norman C. Koon. Typically, the ferromagnetic rings having fixed magnetic state are antiferromagnetically pinned. Typically, a hard or antiferromagnetically-pinned ferromagnetic ring has a coercive field of at least 100 Oe and a softer ferromagnetic ring has a coercive field of less than 100 Oe.

A writing field generated by a writing current $J_w$ will be at least the coercive field of a softer ferromagnetic ring, but less than the coercive field of a hard or antiferromagnetically-pinned ferromagnetic ring. A reading field generated by a reading current $J_r$ will be less than the coercive field of a softer ferromagnetic ring.

Typically, an antiferromagnetic pinning layer comprises a metal oxide such as an iron oxide. Typically, the antiferromagnetic pinning layer comprises Cr or Mn, such as alloys of Cr or Mn, such as FeMn. Preferably, the ferromagnetic rings (especially soft ferromagnetic rings) are poled so that the easy axis of their magnetic moments are oriented to be either clockwise or counterclockwise with respect to the rings.

Typically, the nonmagnetic layer is a ring. Typically, the nonmagnetic layer comprises Cu, Au, Pt, or Ag.

Arrays of memory elements, including both bit arrays and word arrays, may be assembled substantially as described in the above-cited U.S. patent application Ser. No. 130,479.

Figure 11:
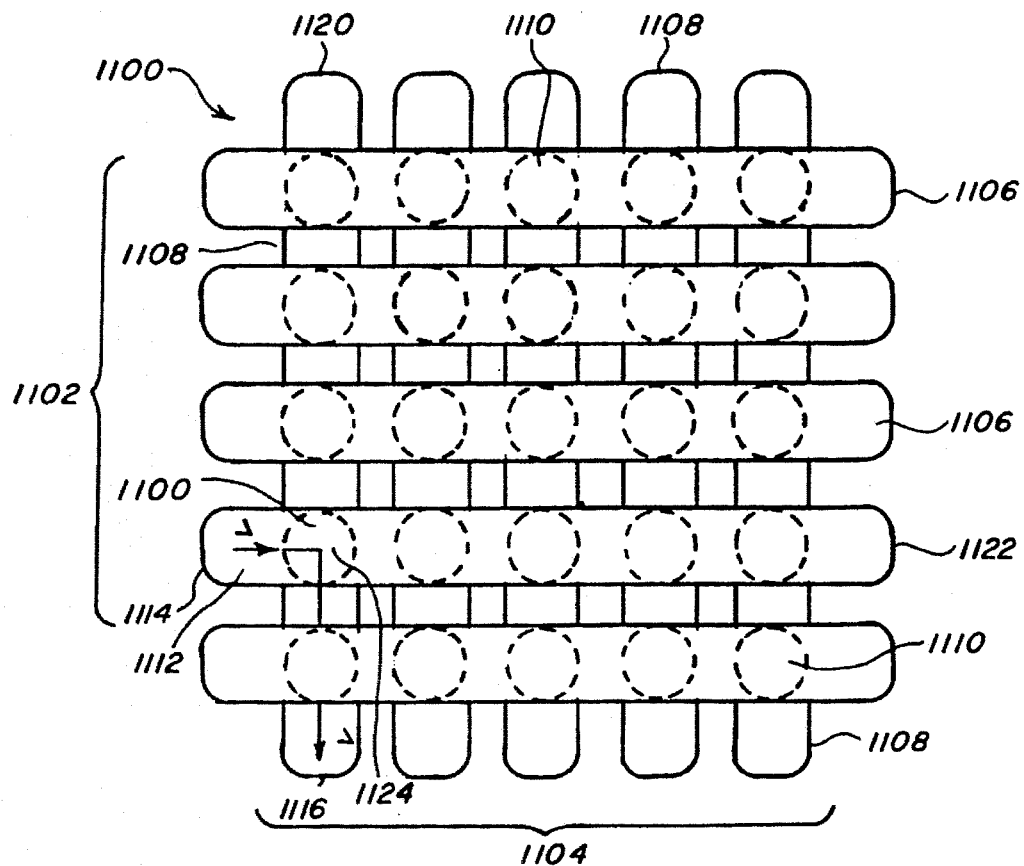
FIG. 11 shows a bit array of memory elements according to the invention.

FIG. 11 shows a simplified matrix 1100 consisting of two independent arrays 1102, 1104 of parallel current carrying bars 1106 and 1108. Preferably, arrays 1102 and 1104 are oriented about 90° to each other. Current carrying bars 1106 of array 1102 are above and not directly in contact with current carrying bars 1108 of array 1104. Current carrying bars 1106, 1108 from arrays 1102 and 1104 are connected at their intersections by the stacked memory elements 1110 sandwiched between them. The interrogation current to any given element comes in one end of these bars, 1106 or 1108, passes through the element and passes out through an end of the other respective contacting bar 1108 or 1106. The other ends of bars 1106 and 1108 provide the leads for measurement of the potential drop, thus providing a true 4-point probe measurement which eliminates the lead resistance in the circuit. For purposes of illustration only, FIG. 11 shows interrogation current 1112 (shown by the lines labelled "J", with the arrow pointing in the direction of current flow) entering through end 1114, flowing through a stack 1110 and exiting through end 1116 of a current carrying bar 1108 of array 1104. Resistance is measured at ends 1120, 1122 of the specified current carrying bars employed in this example that oppose ends 1114 and 1116, respectively.

In order for the x–y matrix of FIG. 11 to give true measurements of a single element, parallel paths of conduction must be eliminated. This goal is accomplished by providing diode film elements 1122 at one end of the stack where contact to the bars are made, either above or below the current bar through which the current enters the stack. This arrangement will prevent any competing currents since all currents are now forced to pass one way through the elements.

Figure 12:
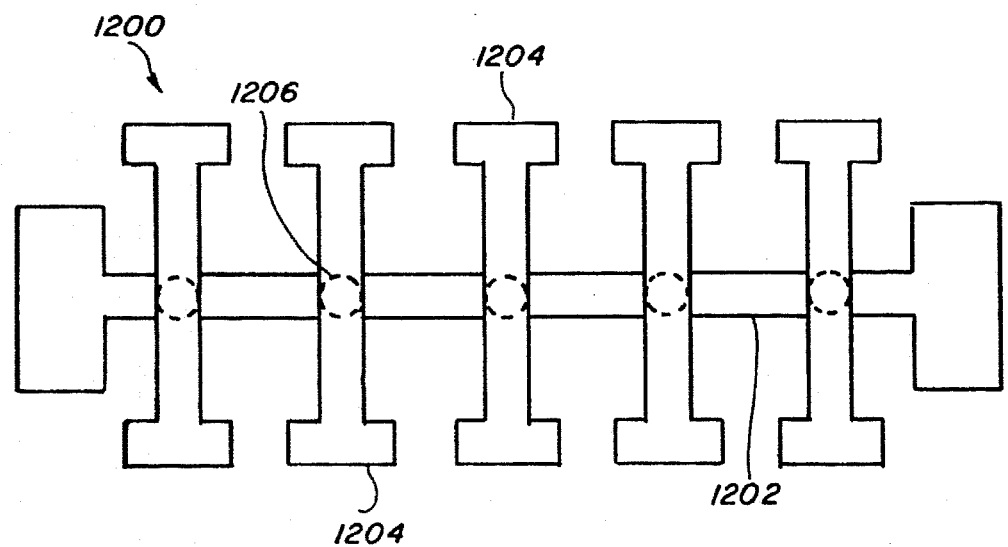
FIG. 12 shows a word array of memory elements according to the invention.

FIG. 12 shows a 5-bit word tree 1200 consisting of one underlying base bar 1202 crossed by five overlayer bars 1204 with a stacked memory element 1206 at each intersection.

Fabrication typically will be done lithographically, substantially as described in the above-cited U.S. patent application Ser. No. 08/130,479. A stack of rings typically will be laid down as a stack of disks on a bottom conductor lead, and subsequently will be "drilled out" using, e.g., a focused ion beam. Focused ion beams, which may have beamwidths of less than 400 Å, are particularly useful in making stacks of rings. Preferably, a focused ion beam is equipped with an end-point detector or equivalent device or method to prevent the focussed ion beam from penetrating a bottom conductor lead. Dielectric is typically laid down, and the structure planarized. After planarization, a top conductor lead is laid down.

In an embodiment where a memory element includes a separate writing circuit, an axial writing conductor may be added either before the dielectric is laid down (as a lithographic step), or after the dielectric is laid down (e.g., using a focused ion beam to "drill" an axial hole for the writing conductor).

The function of the focused ion beam may be replaced by any suitable etching process.

Obviously, many modifications and variations of the present invention are possible in light of the above teachings. It is therefore to be understood that, within the scope of the appended claims, the invention may be practiced otherwise than as specifically described.

What is claimed is:

1. A non-volatile ferromagnetic random access memory element comprising:

a first ferromagnetic ring and a second ferromagnetic ring, wherein one of said ferromagnetic rings is hard or antiferromagnetically-pinned and the other ferromagnetic ring is magnetically softer than said hard or antiferromagnetically-pinned ring;

a non-magnetic conductive layer sandwiched between and contacting said first and second ferromagnetic rings, for preventing essentially all exchange coupling between said first and second ferromagnetic rings;

a first end nonmagnetic conducting layer at one end of said ferromagnetic random access memory element;

a second end nonmagnetic conducting layer at an opposite end of said non-volatile ferromagnetic random access memory element;

said first and second end conducting layers defining a conductive path for flowing a current from said first ferromagnetic ring, through said nonmagnetic conductive layer, to said second ferromagnetic ring, said conductive path being perpendicular to a magnetic moment of at least one of said first and second ferromagnetic rings.

2. The non-volatile ferromagnetic random access memory element of claim 1, wherein said first and second ferromagnetic rings, and said nonmagnetic conductive layer, each have thicknesses of about 10 Å to about 100 Å.

3. The non-volatile ferromagnetic random access memory element of claim 2, wherein said first and second ferromagnetic rings, and said nonmagnetic conductive layer, each have thicknesses of about 50 Å to about 100 Å.

4. The non-volatile ferromagnetic random access memory element of claim 1, wherein said first and second ferromagnetic rings comprise Fe, Co or Ni.

5. The non-volatile ferromagnetic random access memory element of claim 1, wherein said nonmagnetic conductive layer comprises Cu, Pt, Ag or Au.

6. The non-volatile ferromagnetic random access memory element of claim 1, wherein said ferromagnetic rings are poled so that the easy axes of the magnetic moments of said rings are oriented to be either clockwise or counterclockwise with respect to said rings.

7. The non-volatile ferromagnetic random access memory element of claim 1, wherein said hard or antiferromagnetically-pinned ferromagnetic ring has a fixed magnetization forming a closed magnetic circuit about said hard or antiferromagnetically-pinned ferromagnetic ring, and said softer ferromagnetic ring has a magnetization forming a closed magnetic circuit about said softer ferromagnetic ring, said magnetization of said softer ferromagnetic ring being reversible upon the application of a writing current flow between said first end nonmagnetic conducting layer and said second end nonmagnetic conducting layer.

8. The non-volatile ferromagnetic random access memory element of claim 1, wherein said first end nonmagnetic conducting layer and said second end nonmagnetic conducting layer are solid planar layers.

9. The non-volatile ferromagnetic random access memory element of claim 1, wherein said first ferromagnetic ring has an upper surface and a lower surface, and further comprising:

an antiferromagnetic layer between said first ferromagnetic ring and said first end conducting layer, said antiferromagnetic layer having an upper and a lower surface, said upper surface of said antiferromagnetic layer physically contacting said lower surface of said first ferromagnetic ring, said antiferromagnetic layer pinning, by exchange coupling with said first ferromagnetic ring, the orientation of a closed magnetic circuit within the plane of said first ferromagnetic ring.

10. The non-volatile ferromagnetic memory element of claim 9, wherein said antiferromagnetic layer comprises Cr, Mn, a metal oxide, or combinations thereof.

11. The non-volatile ferromagnetic memory element of claim 9, wherein said antiferromagnetic layer comprises FeMn.

12. The non-volatile ferromagnetic memory element of claim 9, wherein said antiferromagnetic layer comprises an oxide of iron.

13. The non-volatile ferromagnetic random access memory element of claim 1, wherein said nonmagnetic conductive layer is a ring.

14. An array of non-volatile ferromagnetic random access memory elements, comprising:

a first row of at least two non-volatile ferromagnetic random access memory elements;

each of said non-volatile ferromagnetic random access memory elements having upper and lower surfaces and including:
(i) a first ferromagnetic ring and a second ferromagnetic ring, wherein one of said ferromagnetic rings is hard or antiferromagnetically-pinned and the other ferromagnetic ring is magnetically softer than said hard or antiferromagnetically-pinned ring;
(ii) a non-magnetic conductive layer sandwiched between said first and second ferromagnetic rings;

a first conducting lead extending across and physically contacting said upper surfaces of each of said at least two non-volatile ferromagnetic random access memory elements in said first row;

a second conducting lead, transverse to, but not contacting, said first conducting lead, extending across and physically contacting only a first one of said at least two non-volatile ferromagnetic random access memory elements in said first row at said lower surface of said first one of said ferromagnetic random access memory elements in said first row, said first and second conducting leads defining a conductive path for flowing a current from said first magnetic layer, through said nonmagnetic metallic layer, to said second magnetic layer, said conductive path being perpendicular to closed magnetic currents in said ferromagnetic rings.

15. The array of claim 14, further comprising a third conducting lead, transverse to, but not contacting, said first conducting lead, extending across and physically contacting only a second one of said at least two non-volatile ferromagnetic random access memory elements at said lower surface of said second one of said non-volatile ferromagnetic random access memory elements in said first row.

16. The array of claim 15, further comprising:

a second row of at least two non-volatile ferromagnetic random access memory elements;

a fourth conducting lead extending across and physically contacting said upper surfaces of said at least two non-volatile ferromagnetic random access memory elements in said second row, but not physically contacting said at least two non-volatile ferromagnetic random access memory elements in said first row;

said second conducting lead extending across and physically contacting only a first one of said at least two non-volatile ferromagnetic random access memory elements in said second row at said lower surface of said ferromagnetic random access memory element in said second row;

said third conducting lead extending across and physically contacting only a second one of said at least two non-volatile ferromagnetic random access memory elements in said second row at said lower surface of said second one of said ferromagnetic random access memory elements in said second row.

17. The array of claim 16, wherein said first and fourth conducting leads are parallel to each other, said second and third conducting leads are parallel to each other, and said first, second, third and fourth conducting leads collectively define a grid.

18. The array of claim 17, wherein said first and fourth conducting leads extend essentially perpendicular to said second and third conducting leads.

19. The non-volatile ferromagnetic random access memory element of claim 1, wherein said hard or antiferromagnetically-pinned ferromagnetic layer has a coercive field of at least 100 Oe and said softer ferromagnetic layer has a coercive field of less than 100 Oe.

20. A method of storing digital data, comprising the steps of:

setting a bit of data as either a "0" or "1" in a non-volatile ferromagnetic random access memory element including:

a first ferromagnetic ring and a second ferromagnetic ring, wherein one of said ferromagnetic rings is hard or antiferromagnetically-pinned and the other ferromagnetic ring is magnetically softer than said hard or antiferromagnetically-pinned ring, and said ferromagnetic rings are poled so that the easy axes of the magnetic moments of said rings are oriented to be either clockwise or counterclockwise with respect to said rings and have magnetizations forming closed magnetic circuits about said rings;

a nonmagnetic conducting layer sandwiched between said first and second ferromagnetic rings;

a first end nonmagnetic conducting layer at one end of said non-volatile ferromagnetic random access memory element; and a second end nonmagnetic conducting layer at an opposite end of said non-volatile ferromagnetic random access memory element;

by exposing said non-volatile ferromagnetic random access memory element to magnetic field which sets said magnetic moment of said softer ferromagnetic ring to be either parallel or antiparallel to said magnetic moment of said hard or antiferromagnetically-pinned ferromagnetic ring, wherein resistance across said non-volatile ferromagnetic random access memory element after the application of said field is set as a "0" or "1".

21. The method of storing digital data of claim 20, wherein said exposing said non-volatile ferromagnetic random access memory element to magnetic field is effected by directing current through said first and second end conducting layers, said first ferromagnetic ring, said nonmagnetic conductive layer, and said second ferromagnetic ring, wherein said current flows essentially parallel to the axis of said rings.

* * * * *